United States Patent [19]

Benveniste

[11] Patent Number: 5,164,599
[45] Date of Patent: Nov. 17, 1992

[54] ION BEAM NEUTRALIZATION MEANS GENERATING DIFFUSE SECONDARY EMISSION ELECTRON SHOWER

[75] Inventor: Victor M. Benveniste, Magnolia, Mass.

[73] Assignee: Eaton Corporation, Cleveland, Ohio

[21] Appl. No.: 732,778

[22] Filed: Jul. 19, 1991

[51] Int. Cl.⁵ .................................. H01J 37/317
[52] U.S. Cl. .............................. 250/492.2; 250/251
[58] Field of Search ............ 250/492.2 R, 492.21, 250/398, 432 R, 251, 492.3

[56] References Cited

U.S. PATENT DOCUMENTS

| | | | |
|---|---|---|---|
| 4,463,255 | 7/1984 | Robertson et al. | 250/251 |
| 4,783,597 | 11/1988 | Misawa et al. | 250/492.2 |
| 4,786,814 | 11/1988 | Kolondra et al. | 250/492.2 |
| 4,804,837 | 2/1989 | Farley | 250/251 |
| 4,886,971 | 12/1989 | Matsumura et al. | 250/492.2 |
| 4,994,674 | 2/1991 | Tamai et al. | 250/492.2 |

OTHER PUBLICATIONS

A. J. T. Holmes, "Theoretical and Experimental Study of Space Charge in Intense Ion Beams" Jan. 1979, Physical Review A, vol. 19, No. 1, pp. 389–407.

Primary Examiner—Jack I. Berman
Assistant Examiner—Jim Beyer
Attorney, Agent, or Firm—Watts, Hoffmann Fisher & Heinke

[57] ABSTRACT

An ion implantation featuring an improved beam neutralizer. A cylindrical electron source encircles the ion beam at a location just before the ion beam enters an implantation chamber. Regularly spaced cavities in the electron source contain wire filaments which are energized to emit electrons. The electrons are accelerated through the region of the ion beam and impact an inwardly facing wall of the cylindrical electron support. This causes low-energy electron emissions which neutralize the ion beam. Performance of the beam neutralizer is enhanced by injecting an ionizable gas into the region between the electron emitting surface and the ion beam.

16 Claims, 7 Drawing Sheets

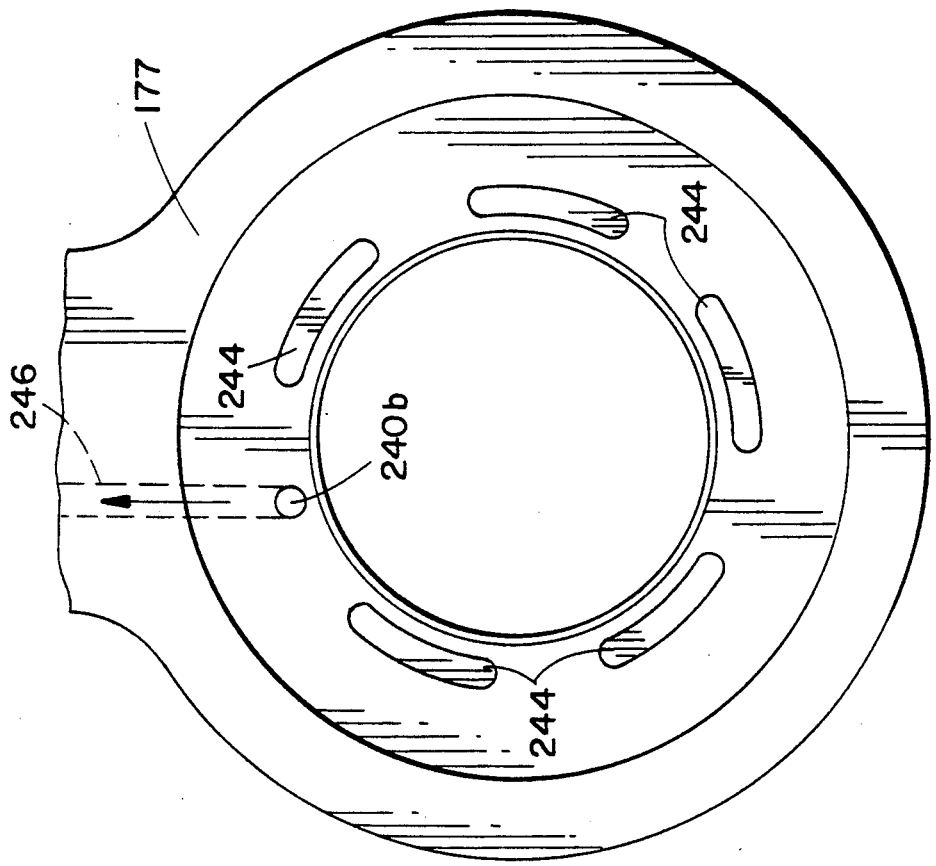
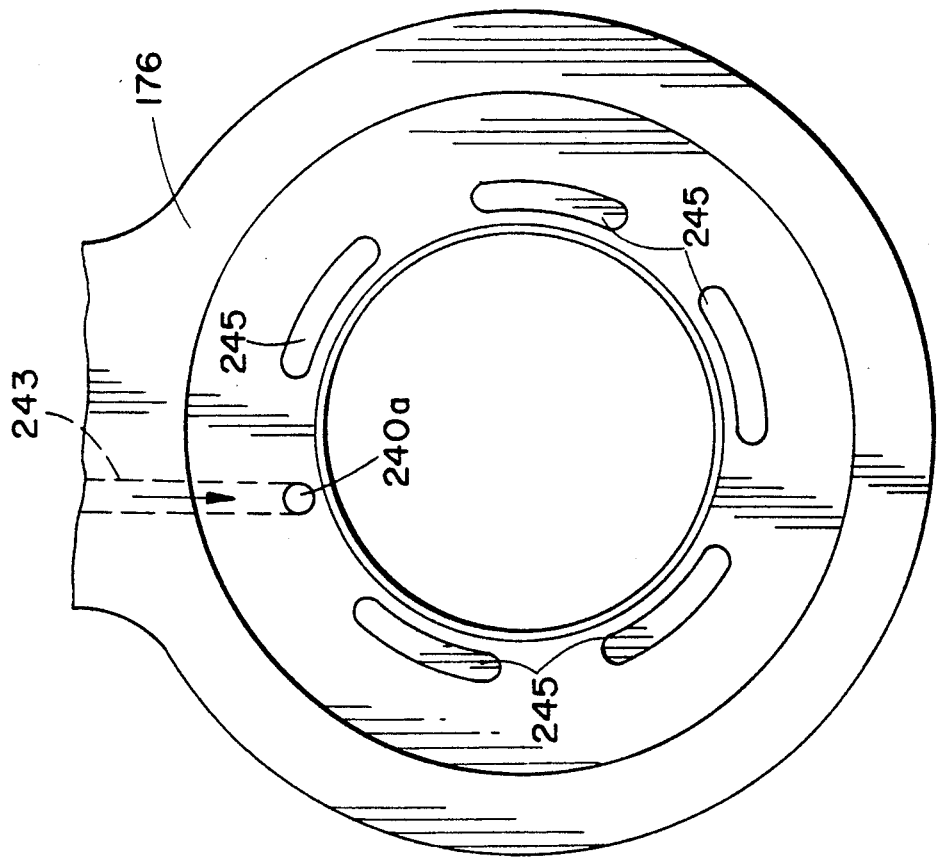
FIG. 3B
FIG. 3A

ION BEAM NEUTRALIZATION MEANS GENERATING DIFFUSE SECONDARY EMISSION ELECTRON SHOWER

FIELD OF THE INVENTION

The present invention concerns an ion implanter and more specifically concerns an ion beam neutralizer for such an ion implanter.

BACKGROUND ART

One use for ion implanters is in doping silicon wafers to form semi-conductors. If the impurities used in doping the wafers can be ionized and formed into an ion beam, the ion beam can be used to dope the silicon wafers by causing the ion beam to impinge upon the wafers.

One problem experienced in ion implantation doping systems is the problem of wafer charging. As the ion beam is directed into contact with the wafer, the wafer charges as the positively-charged ions strike the wafer surface. The charging is often nonuniform and can create large electric fields at the wafer surface which can damage the wafer, making it unsuitable for use as a semi-conductor material.

In some prior art implantation systems, an electron shower device is used to neutralize the space charge of the ion beam. Existing electron shower devices utilize secondary electron emissions caused when an energetic electron strikes a metal surface. Low-energy electrons from the metal surface are either trapped in the ion beam or are directed to impact the wafer surface thereby directly neutralizing the wafer.

The current density of electrons obtained by secondary emissions from a metal surface is limited by the potential difference between the ion beam and the emitting surface. As the beam potential drops due to better neutralization, the secondary emission electron current that can be extracted from the emitting surface decreases. In the case of a charged ion beam directed onto an isolated wafer, the electron current must be equal to the ion beam current for the neutralizer to prevent wafer charging. If the beam potential is initially low, the wafer charges until the ion beam potential is large enough to extract a required amount of electron current from the secondary emission surface. A low potential ion beam does not mean wafer charging does not occur since the center of the beam is positive and the exterior negative due to concentrations of negative charge surrounding the ion beam. In practice, it has been found that the space charge at the metallic electron emitting surface is partially neutralized by slow ions from residual gas ionization along the ion beam path. As a result, higher electron currents than would be expected from theory can be extracted and, in fact, prior art techniques take advantage of residual gas pressures to provide low-energy electrons.

U.S. Pat. No. 4,804,837 to Farley discloses a beam neutralizing system having a source of high-energy electrons which are deflected back and forth through a neutralizing region containing an ionizable gas. As the high-energy electrons pass through the region, they ionize the gas providing low-energy electrons for beam neutralization. The disclosure of the '837 patent to Farley is incorporated herein by reference.

If an ion beam cannot be "sufficiently" neutralized, it tends to blow-up or expand due to the mutual repulsion of the positively-charged ions within the beam. To minimize the region of this blow-up, an electron barrier can be placed up-stream from the electron shower. A typical ion implantation chamber has a support that rotates silicon wafers through the ion beam along a circular path so that the ion beam encounters a wafer, then a wafer support held at ground potential, and then a next subsequent wafer, etc. This causes the ion beam potential to rapidly fluctuate as the wafers pass through the ion beam. Variations in this beam potential are reduced by placement of a constant potential aperture plate upstream from the region of beam neutralization.

Fluctuation in beam potential is reduced by placement of a negatively biased aperture that produces a potential minimum along the ion beam. Electrons from the beam neutralizer cannot penetrate this aperture.

The use of suppression apertures has two undesirable consequences. The aperture introduces a boundary condition causing a sharp divergence in beam potential. This can exacerbate the beam blow-up downstream from the suppression aperture. Additionally, the electric field in the region of the aperture can deflect electrons within the beam neutralizer downstream to the region of the implantation chamber. This has the undesirable result of producing a region of positive charge at a central core of the ion beam and a negative charge at the outer periphery of the ion beam. Stated another way, the ion beam is neutral in a broad sense, but at the wafer surface, a positive charge build-up occurs at the wafer center and a negative charge occurs around the outer circumference. This results in the creation of large, undesirable electric fields.

A stated goal of the '837 patent to Farley is to increase the time period electrons in the region of the ion beam encounter gas molecules thereby increasing the production of secondary electrons.

DISCLOSURE OF THE INVENTION

The present invention concerns an ion implanter for ion beam treatment of workpieces. A typical use of the ion implanter is for ion doping of a silicon material to produce a semiconductor. A source emits positively-charged ions which are formed into an ion beam for treating the workpieces. A beam-forming device includes structure for forming an ion beam from ions as they exit the ion beam source. Such structure typically includes electrodes for accelerating the ions as well as magnets for mass analyzing the ions to separate ions having an inappropriate mass from ions that impact the workpieces.

At an ion implantation station, one or more workpieces, typically silicon wafers, are moved through the ion beam to achieve a controlled implantation dosage. Just upstream from the implantation station, a beam neutralizer injects low-energy electrons into the ion beam to avoid wafer charging by the positively-charged ion beam. The beam neutralizer includes a metallic member at least partially encircling the ion beam for providing beam neutralizing electrons and a number of filaments positioned to direct high-energy electrons into contact with an inwardly facing surface of the metallic member to cause low-energy neutralizing electrons to enter the region of the ion beam and reduce wafer charging.

An ion implanter constructed in accordance with a preferred embodiment of the invention includes a cylindrical member defining an inwardly facing cylindrical electron emitting surface. The filaments for emitting high-energy electrons are positioned within cavities of the cylindrical member. In accordance with this preferred embodiment of the invention, the cylindrical body extends a distance along the ion beam sufficient to achieve beam neutralization. This is accomplished without the need for suppression electrodes which, as noted above, have produced undesirable results in prior art implanters.

BRIEF DESCRIPTION OF THE DRAWINGS

FIG. 3A is a view from the plane defined by the line 3A-3A in FIG. 3;

FIG. 3B is a view from the plane defined by the line 3B-3B in FIG. 3;

BEST MODE FOR PRACTICING THE INVENTION

Figure 1:
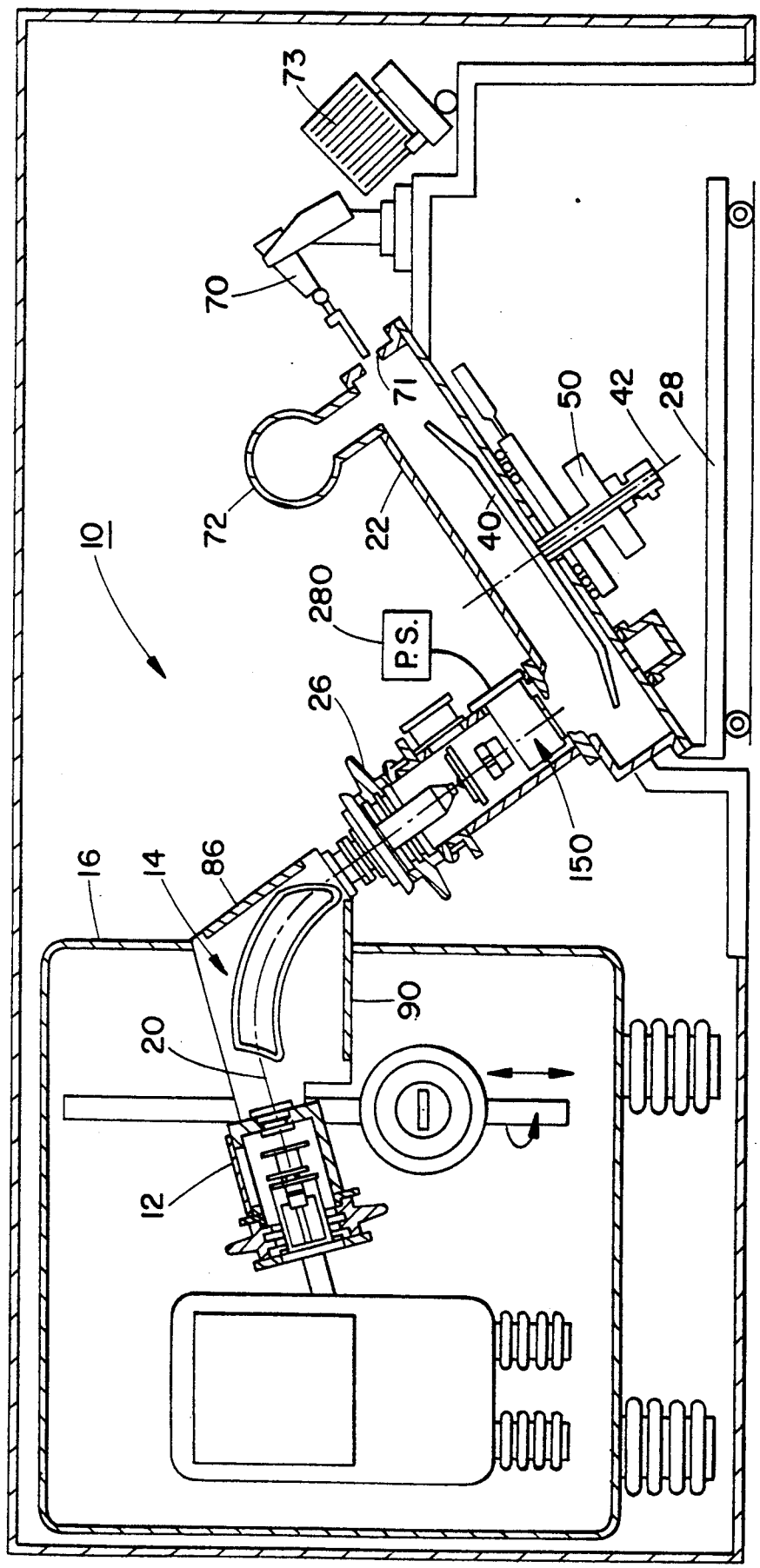
FIG. 1 is a schematic depiction of an ion implantation system.

Turning now to the drawings, FIG. 1 depicts an ion implantation system 10 having an ion source 12 and a beam analyzing magnet 14 contained within a high-voltage housing 16. An ion beam 20 emanating from the source 12 follows a controlled travel path that exits the housing 16 and enters an ion implantation chamber 22. Along the beam travel path from the source 12 to the implantation chamber 22, the ion beam 20 is shaped, evaluated and accelerated due to the potential drop from the high voltage of the chamber 16 to the grounded implantation chamber.

The analyzing magnet 14 causes only those ions having an appropriate mass to reach the ion implantation chamber 22. Along the travel path from the housing 16 to the chamber 22, the ion beam 20 passes through a high-voltage isolation bushing 26 constructed from an electric insulating material that isolates the high-voltage housing 16 from the implantation chamber 22.

The ion implantation chamber 22 is supported on a movable pedestal 28. This allows the chamber 22 to be aligned relative to the ion beam. The ion beam impinges upon a wafer support 40 mounted for rotation about an axis 42. The wafer support 40 supports multiple silicon wafers around its outer periphery and moves those wafers along a circular path. The ion beam 20 intercepts the circular wafer travel path causing ions to impact each of the wafers and selectively dopes those wafers with ion impurities. High-speed rotation of the support 40 is effected by a motor 50 which rotates the support 40 after wafers have been positioned on the support.

Additional details concerning an ion implantation system are contained in U.S. Pat. No. 4,672,210 to Armstrong et al. The subject matter of this prior art patent is incorporated herein by reference.

Silicon wafers are inserted into the ion implantation chamber 22 by a robotic arm 70 through a vacuum port 71. The chamber 22 is evacuated by a vacuum pump 72 to a low pressure equal to the pressure along the ion beam path. The robotic arm 70 transfers wafers back and forth between a cassette 73 for storing the wafers. Mechanisms for accomplishing this transfer are well known in the prior art. Additional pumps (not shown) evacuate the ion beam path from the source 12 to the implantation chamber 22.

Figure 2:
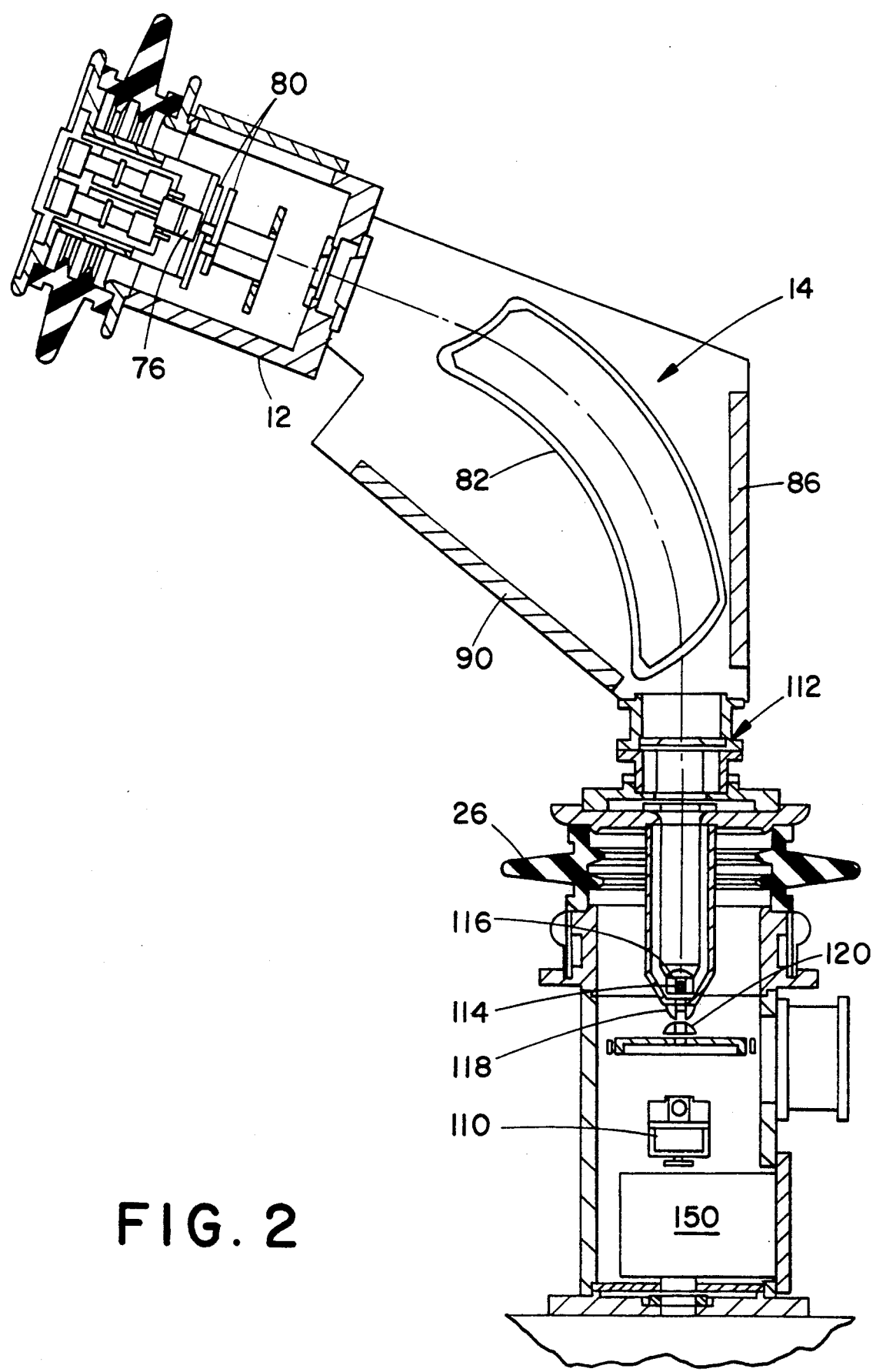
FIG. 2 is an enlarged, partially-sectioned view showing an ion beam path from an ion source to an ion implantation chamber.

As seen in FIGS. 1 and 2, ions exiting the source 12 move along a generally straight line path into the magnet 14. The source 12 includes a high-density plasma chamber 76 having an elliptically shaped exit aperture. Additional details concerning the source 12 are disclosed in U.S. Pat. No. 5,026,997 to Benveniste et al which is incorporated herein by reference. As ions migrate from the plasma chamber 76, they are accelerated away from the chamber 76 by electric fields set up by extraction electrodes 80 positioned outside the exit aperture and enter the region of the magnet 14. The analyzing magnet 14 produces a magnetic field that bends ions having the correct mass to an implant trajectory. These ions exit the analyzing magnet 14 and are accelerated along a travel path leading to the implantation chamber 22. A magnet yoke 82 is bounded by field windings that are not seen in FIG. 2. An implanter control circuit situated within the high-voltage housing 16 adjusts the magnet field strength by controlling current in the magnet's field windings.

The source 12 produces a large fraction of ions having a mass different from the ions used for implantation. These unwanted ions are also bent by the analyzing magnet 14 but are separated from the implantation trajectory. Heavy ions follow a large radius trajectory, for example, and strike a target plate 86 attached to the magnet. Ions that are lighter than those used for implantation follow a tighter radius trajectory and strike a target plate 90. Both the targets 86, 90 tend to heat up as they are bombarded with ions. A coolant for dissipating heat is routed through supports (not shown) for the target plates 86, 90.

A Faraday cup 110 is shown positioned along the beam travel path at a location downstream from the magnet 14. The Faraday cup 110 intercepts ions and prevents them from reaching the implantation chamber 22. The Faraday cup 110 is used during beam set-up to monitor ion beam current. The Faraday cup 110 is also used to intercept ions during other time intervals when ion implantation is suspended, such as when wafers are loaded and unloaded into and out of the chamber 22.

After exiting the magnet 14, the ion beam 20 is focused by a quadrapole lens 112 which is located just prior to the high-voltage isolation bushing 26. The quadrapole lens 112 deflects ions within the ion beam 20 in mutually orthogonal directions to focus the ion beam to an image point 114 in a manner similar to the focusing effect a convex lens has on light beams. Ions within the beam 20 that are not sufficiently deflected and focused by the quadrapole lens 112 exit from the ion beam and never reach the ion implantation chamber 22. Ions that reach the region of the image point 114 are accelerated by a series of electrodes 116, 118, 120 to a desired final implantation energy. During ion implantation, the Faraday cup 110 is withdrawn from the ion beam path and the ion beam enters a beam neutralizer 150. The beam neutralizer 150 injects low-energy electrons into the ion beam at a rate equal to the ion beam current, thereby minimizing wafer charging within the implantation chamber 22.

Figure 4:
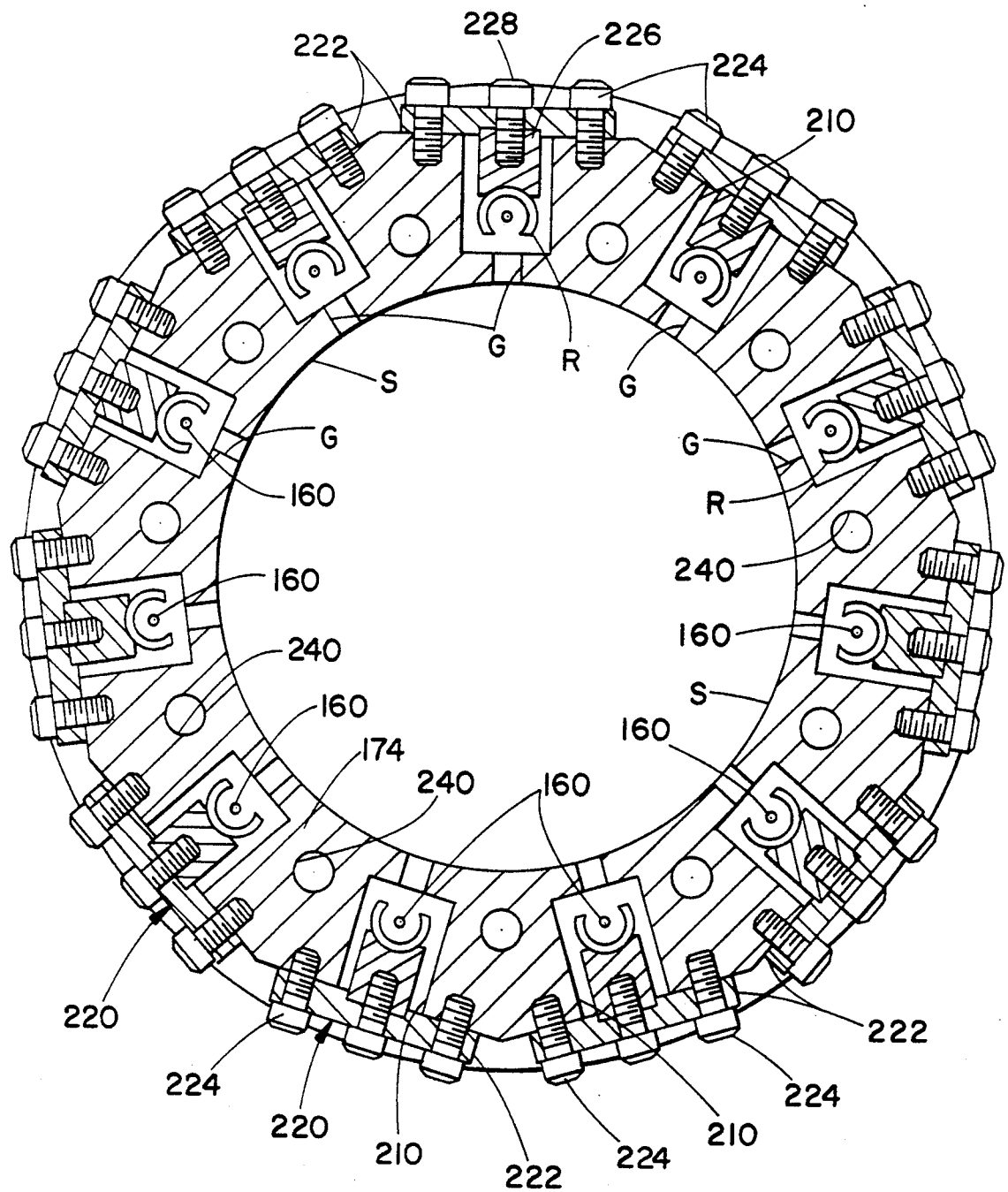
FIG. 4 is a section view showing a cylindrical support for multiple filaments and also illustrating an inwardly facing secondary electron emitting surfaces.
Figure 5:
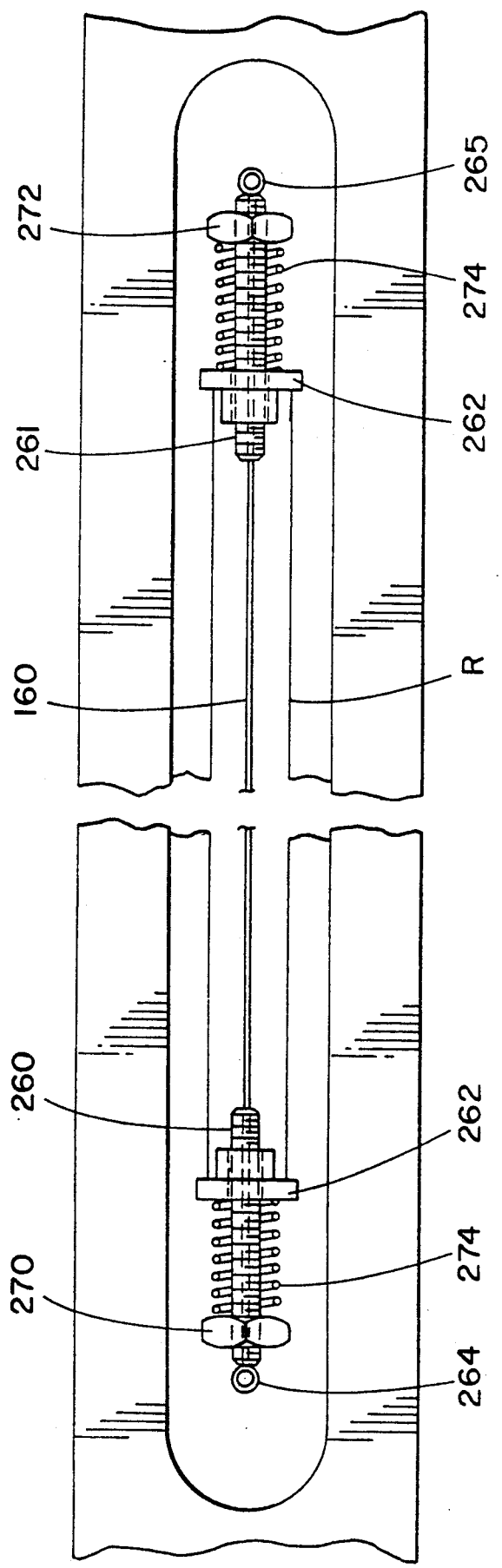
FIG. 5 is an enlarged plan view of a filament for injecting high-energy into the region of the beam neutralizer.
Figure 6:
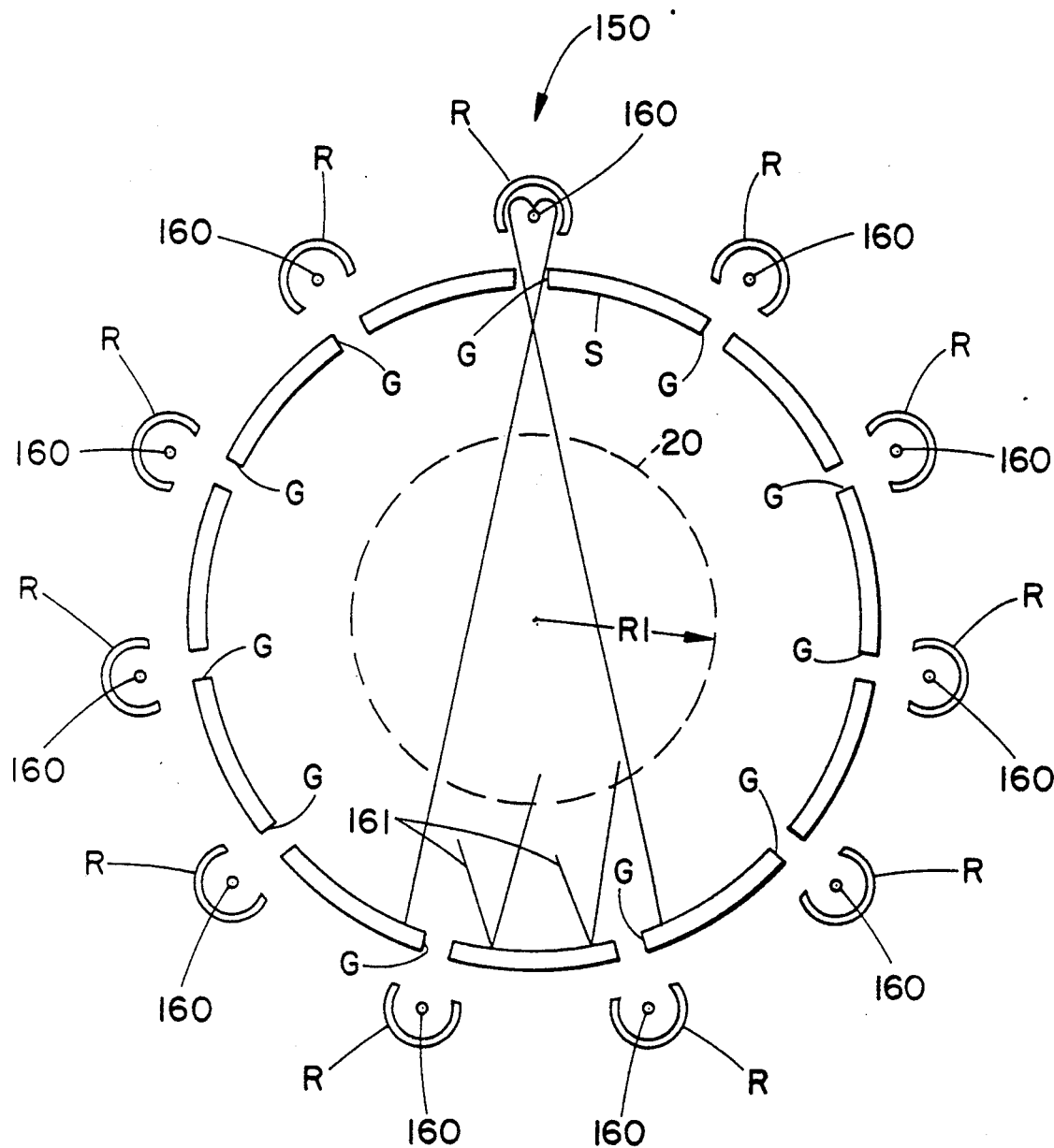
FIG. 6 is a schematic depiction of the beam neutralizer showing secondary electron generation from high-energy primary electrons emitted from multiple equally spaced filaments.

FIGS. 3, 3A, 3B and 4–6 depict a preferred embodiment of a beam neutralizer 150 constructed in accordance with the present invention. FIG. 6 schematically depicts the operation of the neutralizer. In this depiction, the beam neutralizer 150 is positioned in relation to an ion beam 20 having a radius R1. Spaced radially outward from the ion beam is a generally cylindrical surface S that provides low-energy secondary electrons for neutralizing the ion beam. Radially outside the surface S, a number of elongated filaments 160 emit electrons in all directions. Curved reflectors R redirect electrons moving away from the beam 20 through gaps G causing a high percentage of emitted electrons to be accelerated through the region of the ion beam 20 to collide with the surface S. The collision between high-energy electrons and the surface S causes low-energy secondary electron emissions 161. The secondary electrons move from the electron emitting surface S into the region of the ion beam to neutralize the ion beam.

The cylindrical electron emitting surface S extends along the ion beam a distance D of approximately ten inches. This length allows a sufficient concentration of electrons per unit time (beam neutralization current) to neutralize the beam even as the ion beam potential rapidly changes due to wafers rotating through the ion beam.

Preferred construction details of the beam neutralizer 150 are presented below. The ion implanter structure surrounding the ion beam travel path at the region of the neutralizer 150 is grounded. The surface S is also grounded. Current through the filaments 160 is approximately 6 amperes due to application of a d.c. potential across each filament of 10 volts. The reflectors R are held at a potential of −300 v d.c. with respect to ground and are electrically connected to the negative end of the filaments 160.

Figure 3:
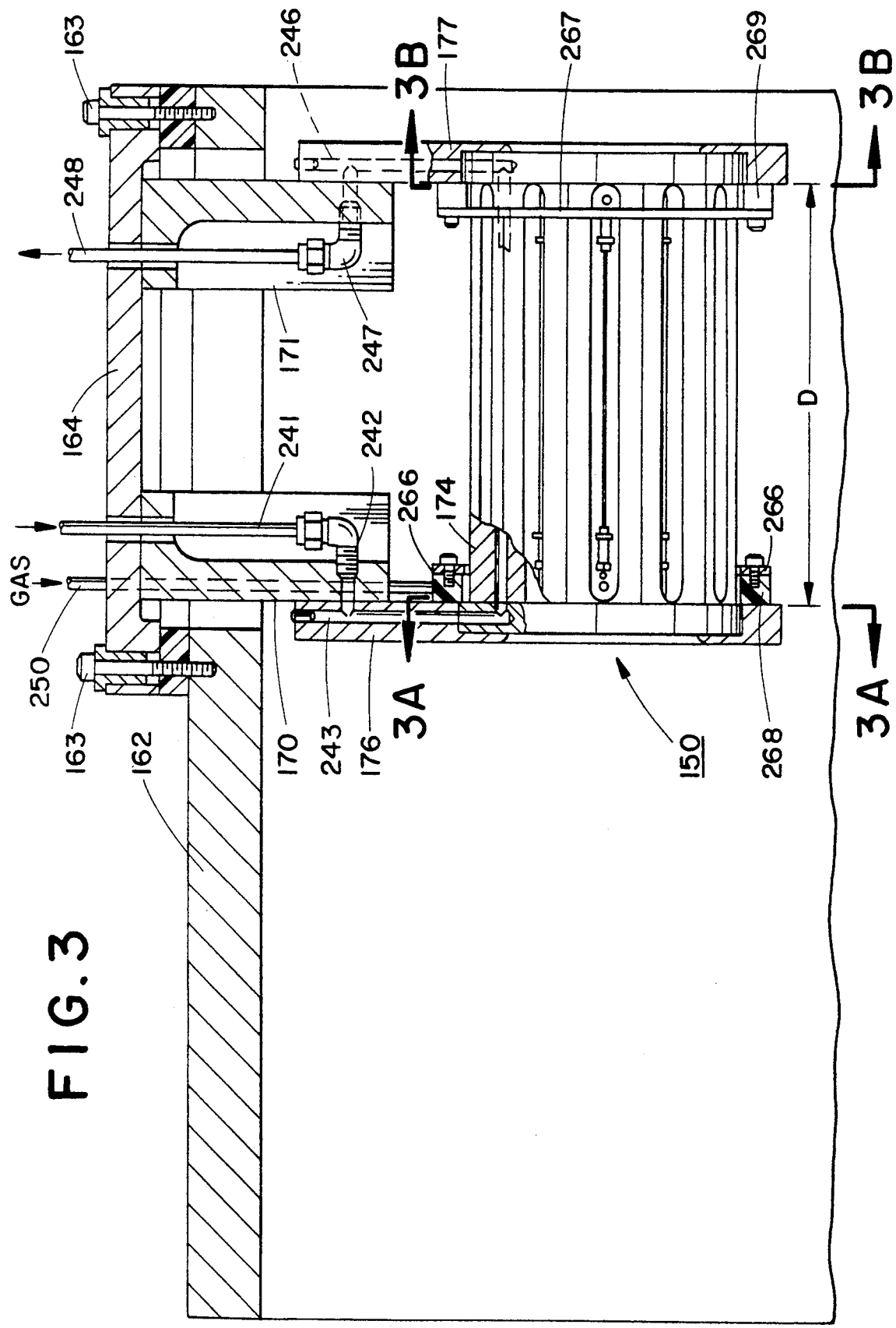
FIG. 3 is a partially-sectioned side view of an ion implanter showing a beam neutralizer for injecting low-energy electrons into an ion beam.

As seen in FIG. 3, the beam neutralizer 150 is connected to a side wall 162 that defines a portion of the ion beam travel path. Threaded connectors 163 extend through a support plate 164 which supports the beam neutralizer 150 and engage a threaded aperture in the side wall 162. The beam neutralizer 150 can thus be removed from the ion implantation system if needed. Since the region through which the ion beam travels on its way to the implantation chamber is evacuated, the connection between the plate 164 and the side wall 162 must maintain this vacuum. An insulator 166 electrically separates the plate 164 from the side wall 162. Electrically isolating the plate 164 from the side wall 162 allows neutralizer current injected into the ion beam to be monitored.

Attached to the plate 164 and extending radially inward to the region of the ion beam are two flanges 170, 171. A neutralizer body 174 defines the surface S and circumscribes the ion beam travel path. The neutralizer body is supported by axially-spaced end plates 176, 177 attached to the flanges 170, 171 by means of threaded connectors (not shown).

FIG. 4 shows a cross section of the neutralizer body 174. The body 174 defines multiple-spaced cavities 210 which position the electron emitting filaments 160. The filaments 160 are preferably 10 mill-diameter tungsten wires and extend the length of the neutralizer 150. They are aligned with gaps G in the surface S opening radially inward toward the region of the ion beam 20.

Each of the filaments 160 is supported by its own filament assembly 220. Each of the assemblies 220 includes a support plate 222 connected to the neutralizer body 174 by threaded connectors 224. A filament mounting block 226 is connected to the support plate 222 by means of threaded connectors 228. The mounting block 226 supports the electron reflectors R which are biased at the negative potential of the filaments 160. This causes electrons thermionically emitted from the filament to be reflected away from the electron reflectors 230 through the gap G and into the region of the ion beam.

Bombardment of high-energy electrons against the electron emitting surface S causes the body 174 to heat up due to the transfer of energy from the high-energy electrons as they bombard the surface. For this reason, a coolant (preferably water) is routed through multiple elongated passageways 240 extending generally parallel to the filaments 160.

The coplant is routed through an inlet tube 241 to a fitting 242 that delivers the coolant to a passageway 243 in the end plate 176. Coolant is forced into the body 174 in one direction parallel to the beam travel path to the second end plate 177 which defines an arcuate recess 244 (see FIG. 3B) for delivering coolant from a first passageway 240a to an adjacent passageway. The direction of coolant flow then reverses so coolant moves back along the ion beam path to the first end plate 176 which defines similar arcuate recesses 245 to interconnect adjacent passageways 240. After traveling along a winding route while absorbing heat from the body 174, the coolant traverses the last passageway 240b and exits the end plate 177 through an exit passageway 246 defined in the end plate 177. As seen in FIG. 3 a fitting 247 and tube 248 route heated coolant away from the ion implanter to a heat exchanger (not shown).

Experience with the ion beam neutralizer 150 indicates that the performance can be enhanced if a low concentration of ionizable gas such as argon is also injected into the region of the high-energy electrons. Ionization by collision produces slow ions which partially neutralize negative space charges at the cylinder walls. This gas is delivered by a tube 250 which extends through the plate 164 and the flange 170. The tube 250 delivers gas into the neutralizer at a radial position approximately the same as the emitting surface S of the body 174 at an entrance end of the neutralizer. A throughpassage machined in the body 174 accommodates the gas delivery tube 250.

FIG. 5 is an enlarged view showing a filament assembly 220 positioned within one of the cavities defined by the body 174. The wire filament 160 depicted in FIG. 5 extends through a center bore of two elongated threaded studs 260, 261 that are spaced from the reflector R by electrical insulators 262. Opposite ends of the filament 160 are connected by crimping to electrical connectors 264, 265 which are connected to an external power source for energizing the filament 160. In the preferred embodiment of the invention, each of the multiple filaments 160 spaced around the circumference of the ion beam is connected in parallel to an energy source by means of two annular busses 266, 267 larger in diameter than the neutralizer body 174 and spaced from the end plates 176, 177 by insulators 268, 269. The filaments are energized with a direct current voltage that sets up a current causing the filaments to heat up and thermionically emit electrons. These electrons have an electric potential of approximately −300 volts d.c. and are accelerated to the surface S by an electric field within the neutralizer.

An external surface of the two studs 260,261 is threaded so that tension-adjusting nuts 270,272 can be threaded over the studs 260,262. Springs 274 are trapped between the insulators 262 and the tension-adjusting nuts 270,272. By adjusting the position of the tensioning nuts 270,272 along the studs, the compression of these springs 274 can be adjusted thereby adjusting the tension of the filament 160.

A power supply 280 (FIG. 1) energizes the filaments 160 and reflectors R. No feedback adjustment to current or voltage is required. The supply is connected to the busses 266,267 and biases the reflectors at a voltage of −300 volts d.c. with respect to the grounded body 174 and applies a 10-volt signal across the parallel coupled filaments 160. As the beam potential varies during the operation of the implanter, the neutralizer current varies to neutralize the beam and minimize wafer charging.

A preferred embodiment of the present invention has been described with a degree of particularity. It is the intention that the invention include all changes and modifications of the disclosed design falling within the spirit or scope of the appended claims.

I claim:

1. An ion implanter for ion beam treatment of workpieces comprising:
   a) an ion beam source that emits positivity-charged ions used in treating the workpieces;
   b) beam forming means comprising structure for forming an ion beam from ions existing the ion beam source;
   c) implantation means comprising structure for positioning workpieces in the ion beam and for controlling implantation dosage;
   d) beam neutralization means including:
      i) an electrically conductive neutralizing body encircling the ion beam having an inwardly facing curved surface for providing beam neutralizing electrons; and
      ii) an odd-number plurality of elongated wire filaments generally parallel to an axis of the ion beam and spaced at regular intervals around such axis of the ion beam to direct high-energy electrons into contact with the inwardly facing surface of the neutralizing body to cause neutralizing electrons to enter the region of the ion beam; and
   e) power supply means for electrically biasing the neutralizing body with respect to the plurality of filaments.

2. The ion implantes of claim 1 wherein the filaments are positioned radially outward of the inwardly facing curved surface of the neutralizer body.

3. The ion implanter claim 1 wherein the neutralizing body has an odd number of regularly spaced filament support cavities opening through the inwardly facing curved surface of the neutralizer body to position the wire filaments at regular intervals around the ion beam.

4. The ion beam implantation system of claim 1 additionally comprising a source of ionizable gas for injecting the gas into a region radially inward of the inwardly facing surface to provide low-energy ions in said region.

5. An implantation system according to claim 1 wherein the filaments extend substantially the length of the neutralizing body.

6. An implantation system according to claim 1 including primary electron directing means associated with each filament for directing primary electrons emitted from such filament toward an uninterrupted portion of the inwardly facing surface.

7. An ion beam neutralizer for use with an ion implanter comprising:
   a) a metallic body having a passage dimensioned to allow an ion beam to pass through the metallic body, said metallic body held at a fixed electric potential;
   b) a plurality of elongated electron emitting filaments oriented generally parallel to a direction of ion beam movement through the metallic body, said filaments mechanically coupled to the metal body and electrically isolated from said metal body;
   c) primary electron directing means associated with each filament for directing primary electrons generated by such filament toward an uninterrupted portion of a generally cylindrical inner surface of the metallic body;
   d) support structure for mounting the metal body realative to the ion beam, and
   e) power supply means for biasing the electron emitting filaments at a negative potential relative to the metallic body and for applying a potential across the filaments to set up a current for heating the filaments sufficiently to emit electrons;
   f) said metallic body including a generally cylindrical surface facing the ion beam to emit low-energy electrons as high-energy electrons from said filaments strike said cylindrical surface.

8. The neutralizer of claim 7 wherein the metallic body defines passageways for routing a coolant through the body to dissipate heat caused by high-energy electron collisions with the cylindrical surface.

9. The neutralizer of claim 8 wherein the support structure further includes structure for routing said coolant to and from the metallic body.

10. The neutralizer of claim 8 additionally comprising a gas source for injecting an ionizable gas into a region radially inward of the generally cylindrical surface of said metallic body.

11. A beam neutralizer according to claim 7 wherein the filaments extend substantially the length of the metallic body.

12. A beam neutralizer according to claim 7 wherein the filaments are spaced at regular intervals.

13. An ion beam neutralizer use with an ion implanter comprising:
   a) a plurality of axially elongated filaments supported under tension at regularly spaced intervals on a circumference of a circle;
   b) an arcuate, axially elongated electron reflector partially surrounding at least one of the filaments and negatively biased with respect to that one of the filaments for directing electrons emitted from that one of the filaments substantially along a diameter of the circle;
   c) an electrically-conductive body for providing beam neutralizing electrons defining an inner cylindrical surface concentric with the circle and radially inward of the filaments, wherein the surface includes gaps aligned with the filaments and extending the length of the body for conducting electrons emitted from the filaments toward an interior of the inner cylindrical surface;

d) at least one coolant passageway in the body for circulating a cooling fluid;

e) a pair of axially spaced, relatively electrically biased annular bus strips straddling end portions of the body, wherein the bus strips are electrically connected with the filaments and electrically isolated from the body for biasing the filaments; and f) at least one flange extending from the body for demountably supporting the body.

14. A beam neutralizer according to claim 13 in which the electrically conductive body includes a throughpassage for conducting a gas into the beam passage.

15. A beam neutralizer according to claim 13 wherein the filaments extend substantially the length of the body.

16. A beam neutralizer according to claim 15 wherein the inner cylindrical surface is at least on the order of ten inches long.

* * * * *